(12) United States Patent
Buechel

(10) Patent No.: US 7,960,723 B2
(45) Date of Patent: Jun. 14, 2011

(54) STACKED ELECTRO-OPTICALLY ACTIVE ORGANIC DIODE WITH INORGANIC SEMICONDUCTOR CONNECTION LAYER

(75) Inventor: Michael Buechel, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 234 days.

(21) Appl. No.: 12/373,555

(22) PCT Filed: Jul. 12, 2007

(86) PCT No.: PCT/IB2007/052785
§ 371 (c)(1),
(2), (4) Date: Jan. 13, 2009

(87) PCT Pub. No.: WO2008/010161
PCT Pub. Date: Jan. 24, 2008

(65) Prior Publication Data
US 2009/0321722 A1    Dec. 31, 2009

(30) Foreign Application Priority Data

Jul. 19, 2006    (EP) ..................... 06117442

(51) Int. Cl.
*H01L 35/24* (2006.01)
*H01L 51/00* (2006.01)
(52) U.S. Cl. ........... 257/40; 257/E51.003; 257/E51.018; 438/82; 438/99
(58) Field of Classification Search ............ 357/40, 357/E51.003, E51.018; 438/82, 99
See application file for complete search history.

(56) References Cited

U.S. PATENT DOCUMENTS

| | | | |
|---|---|---|---|
| 6,818,329 B1 | 11/2004 | Liao et al. | |
| 2002/0145380 A1 | 10/2002 | Aziz et al. | |
| 2005/0248267 A1 | 11/2005 | Gyoutoku et al. | |
| 2005/0260451 A1 | 11/2005 | Kijima | |
| 2005/0264174 A1 | 12/2005 | Liao et al. | |
| 2006/0087225 A1 | 4/2006 | Liao et al. | |
| 2007/0215868 A1* | 9/2007 | Forrest et al. | 257/40 |
| 2010/0207115 A1* | 8/2010 | Iou | 257/40 |

FOREIGN PATENT DOCUMENTS

EP    1651011 A1    4/2006

OTHER PUBLICATIONS

Soon Moon Jeong et al; Improved Stability of Organic Light-Emitting Diode With Aluminum Cathodes Prepared by Ion Beam Assisted Deposition, Science and Technology of Advanced Materials, vol. 6, pp. 97-102, 2005.

* cited by examiner

*Primary Examiner* — Cuong Q Nguyen
*Assistant Examiner* — Cathy N Lam

(57) ABSTRACT

A stacked electro-optically active organic diode has an anode electrode (102), a cathode electrode (162), a first electro-optically active organic layer (110) arranged between the electrodes (102, 162), and a second electro-optically active organic layer (130) arranged between said first active organic layer (110) and said cathode (162). A low electron affinity layer (120) is arranged between the first electro-optically active organic layer (110) and the second electro-optically active organic layer (130), and is formed of a first transparent inorganic semi-conductor material. A high electron affinity layer (121) is arranged between said second electro-optically active organic layer (130) and the low electron affinity layer (120), and is formed of a second transparent inorganic semiconductor material, wherein said second transparent inorganic semiconductor material has a higher electron affinity than said first inorganic semiconductor material. The low and high affinity layers (120, 121) constitute a connection layer of only two semiconductor (sub-)layers which allow for transparent, thick layers, and as a result the diode can be both efficient and reliable.

14 Claims, 2 Drawing Sheets

US 7,960,723 B2

STACKED ELECTRO-OPTICALLY ACTIVE ORGANIC DIODE WITH INORGANIC SEMICONDUCTOR CONNECTION LAYER

This application is a national stage application under 35 U.S.C. §371 of International Application No. PCT/IB2007/052786 filed on Jul. 12, 2007, and published in the English language on Jan. 24, 2008, as International Publication No. WO/2008/010161, which claims priority to European Application No. 06117442.1, filed on Jul. 19, 2006, incorporated herein by reference.

FIELD OF THE INVENTION

The present invention relates generally to electro-optically active organic diodes, such as used in organic solar cells and as organic light emitting diodes (OLEDs). More specifically it relates to a stacked electro-optically active organic diode comprising an anode electrode layer, a cathode electrode layer, a first electro-optically active organic layer arranged between the electrodes and a second electro-optically active organic layer arranged between said first electro-optically active organic layer and said cathode electrode layer.

BACKGROUND OF THE INVENTION

Electro-optically active organic diodes are for example used as organic light emitting diodes (OLEDs), in lightning devices, in display devices and in organic solar cell devices. An organic diode in an organic solar cell device is arranged to generate electricity from light, whilst in a lightning device, the organic diode is arranged to generate light from electricity. Nevertheless, these are just different manifestations of common fundamental properties pertaining to certain electro-optically active organic materials. Progress and development in one area, such as in the area of lightning devices and OLEDs, thus can be utilized for improvements in the other area, such as in the area of organic solar cell devices.

This far, efforts have mostly been spent on devices for generation of light, and in particular on OLEDs. This is partly owing to that the obtainable efficiency, reliability and operational lifetime so far have been considered too poor for viable organic solar cell devices, especially in light of what can be achieved in conventional solar cell devices. Although these properties are desirable to improve also in the area of lightning application devices, the requirements are often not fully as high, and there are already commercially available products, such as displays based on OLED technology. Partly, this is owing to that OLEDs emit light and thus do not require backlighting such as in conventional liquid crystal displays (LCDs). Some other advantages of electro-optically active organic diodes in general are for example that they are comparatively easy and cost efficient to make, can be fabricated in thin, flexible layers and even be made transparent.

Recent electro-optically active organic diodes have shown great progress, especially in efficiency and lifetime, however the increased lifetime has in some cases lead to problems with reliability. Reliability is a problem in general in the area of electro-optically active organic diodes and there is a general need for improved operational life times. Although many of the desired and beneficial properties are owing to the organic nature, there are also some drawbacks that follow from this, for example, organic materials are in general more sensitive to harsh physical treatments and high temperatures compared to many inorganic materials.

So called stacked OLED structures have been presented, which for example are used to improve performance. These are also known as tandem, or cascaded, OLEDs. A stacked OLED comprises several organic layers, each comprising at least one emissive, active layer. The organic layers in a stacked OLED are also known as organic units, organic electroluminescent units, organic EL units or simply EL units. The EL units in a stacked OLED are arranged between a common anode and a common cathode. Additionally, in order to be efficient, there is typically a so called connection layer arranged between the EL units. Connection layers are also known connection units, intermediate connectors or connector units.

Known connection layers include organic layers, which typically attain good transparency. Since the light emitted in an OLED has to be let out, good transparency is in general an important property. However, due to the increased number of layers in a stacked OLED compared to an ordinary, single EL unit OLED, transparency becomes even more important. Too low transparency in the additional layers may result in that the stacked OLED provides even less light than a corresponding single EL unit OLED.

The prior art also includes use of inorganic connection layers.

US 20050264174 discloses a tandem OLED comprising an inorganic connector unit having a layer structure of three layers; a low work function (<4 eV) metal layer towards the anode side, a metal compound p-type semiconductor layer towards the cathode side and a high work function (>4 eV) metal layer in-between.

However, owing to the nature of metals and the number of the layers in this structure, the transparent properties are poor. Metals in general have comparatively high light absorption and reflectivity. The latter may for example also result in undesired optical cavity effects. To some extent, problems related to metals can be alleviated by very thin layers, however, absorption and reflectivity may still be comparatively high, and transparency will still be a problem when the number of EL units increase. Also, doping, such as in a p-type semiconductor, often have detrimental influence on transparency.

In conclusion, there is a general desire for efficient electro-optically active organic diodes and increased reliability, and there is also, in particular for stacked electro-optically active organic diodes, such as stacked OLEDs, a desire for alternative connection layers, in particular such of good transparency and without the need of using metal layers.

SUMMARY OF THE INVENTION

It is an object of the present invention to overcome or at least alleviate problems in the prior art. A specific object is present an inorganic alternative to conventional connection layers in stacked electro-optically active organic diodes. The invention is defined by the appended independent claims. Preferred embodiments are set forth in the dependent claims and in the following description and drawings.

Although there is no wish to be bound by any particular theory, the invention is partly based on the discovery that one large contributor to unreliable conventional stacked electro-optically active organic diodes, and especially such of large areas, seems to be shorts that occur between cathode and anode electrodes, and the extent of damage such shorts have on the organic material arranged in between. It further seems like one factor contributing to these shorts is the occurrence of high field strengths in the cathode owing to unintentional physical defects in the cathode, especially defects having sharp edges, which can give rise to very high, local field strengths. The sharp edges may for example be located at pin holes or at a rough or damaged (e.g. due to undesired presence of particles), or in any other way defect, surface of the cathode. A result from increased field strength may be locally raised temperatures and sometimes softening and melting cathode material. Since the organic materials used in electro-optically active organic diodes, and organic materials in general, only can withstand comparatively low temperatures and often have a comparatively low melting/pyrolysis temperature, the raised temperatures may cause the organic layer material to degrade and/or soften, which in combination with the often high electro-static pressure of many bars between cathode and anode, seem to increase the risk of damaged organic material and a short to occur between the cathode and anode through the organic material, typically at spots where the organic layer, for example due to the above reason, has become very thin or damaged in any other way. As a result there can be relatively high currents, which lead to even higher temperatures and greater damage.

Hence, the above-mentioned and other objects that will be evident from the following description, are achieved by a a stacked electro-optically active organic diode comprising an anode electrode layer, a cathode electrode layer, a first electro-optically active organic layer arranged between the electrodes, a second electro-optically active organic layer arranged between said first electro-optically active organic layer and said cathode electrode layer. There is a low electron affinity layer arranged between the first electro-optically active organic layer and the second electro-optically active organic layer, said low electron affinity layer being formed of a transparent first inorganic semiconductor material, and there is a high electron affinity layer arranged between said second electro-optically active organic layer and the low electron affinity layer, said high electron affinity layer being formed of a transparent second inorganic semiconductor material having a higher electron affinity than the first inorganic semiconductor material.

"Electro-optically active" here refers to the ability to transform light to electricity, and/or electricity to light. When it is used to describe a layer it typically means that the layer comprises a material, for example in form of a sub-layer, that has this ability and when used to describe a diode it typically means that the layer comprises a material, for example in form of a layer, that has this ability, which for example is the case for an organic light emitting diode (OLED).

An "anode electrode" typically is an electrode for hole injection, e.g. in the form of a base layer deposited on a carrier or substrate.

A "cathode electrode" typically is an electrode for electron injection, e.g. in the form of a deposited top layer.

The low electron affinity layer combined with the high electron affinity layer constitute a connection layer of two (sub-)layers only, none of which is a metal. Two layers only, and use of semiconductor materials allows for great transparency and thus for thicker layers. A thick inorganic connection layer may reduce the risk of a short to occur, for example, in a situation of an imminent short, it reduces the risk of detrimental impact on adjacent organic layers and thus the risk of a short to occur between the cathode and the anode. Thus, the diode can be both efficient and reliable. Inorganic materials are typically not as sensitive as an organic materials and are thus suited for protective purposes.

The high electron affinity layer in combination with the low electron affinity layer can be viewed upon as a connection layer where electrons at a highest occupied molecular orbital (HOMO) level in the second electro-optically active organic layer are (re)used for electron injection at a lowest unoccupied molecular orbital (LUMO) level in the first electro-optically active organic layer. The effect is based on alignment of Fermi levels at the interface between the high and low electron affinity layers. Further, the low electron affinity layer adapts and minimizes the injection barrier for electrons into the LUMO of the first electro-optically active organic layer, and the high electron affinity layer adapts and minimizes the injection barrier for holes into the HOMO of the second electro-optically active organic layer.

The first inorganic semiconductor material may have an electron affinity between 0.5 eV and 3.5 eV.

The second inorganic semiconductor material may have an electron affinity between 4 eV and 8 eV.

The low electron affinity layer may have a thickness of at least 50 Å, preferably above 200 Å. The high electron affinity layer may have a thickness of at least 20 Å, preferably above about 200 Å.

The first inorganic semiconductor material and/or second inorganic semiconductor material may have a higher melting temperature than the material of the cathode layer.

The first inorganic semiconductor material may have a band gap greater than about 2.7 eV, and preferably greater than about 3 eV. This means that blue electroluminescence may not be absorbed An advantageous side effect with a band gap greater than about 2.7 eV is that the low electron affinity layer also may serve as a exciton blocking layer.

The first inorganic semiconductor material may comprise a chalcogenide or binary oxide of an alkali earth metal or lanthanide, preferably BaO, BaSe, $La_2O_3$ or $Ce_2O_3$.

The second inorganic semiconductor material may comprise a binary oxide of a transition metal, preferably an electrochromic oxide, such as $WO_3$, $MoO_3$ or $V_2O_5$.

The stacked electro-optically active organic diode may further comprise a short protection layer arranged between the cathode electrode layer and the second electro-optically active organic layer, and adjacent to said cathode electrode layer, wherein said short protection layer is formed of an inorganic semiconductor material.

The short protection layer prevents direct contact between the cathode layer and the organic layer, which reduces the risk that the cathode layer will have detrimental impact on the organic layer, and this, in turn, reduces the risk of a short to occur between the cathode and the anode. An inorganic material is typically not as sensitive as an organic material and it is thus better suited for protective purposes. Moreover, a semiconductor material typically has good transparency, which is a desirable property for a layer arranged between the cathode electrode and organic layers.

Furthermore, the stacked electro-optically active organic diode may comprise a cover layer arranged in contact with a surface of the cathode layer so that the cathode layer is positioned between the second electro-optically active organic layer and said cover layer, wherein said cover layer is formed of a substantially inert material with respect to a cathode layer material in contact with said cover layer, and wherein said inert material is deposited on said surface of said cathode layer so that the complete surface is covered and surface defects eliminated. When the cover layer is deposited and covers the cathode surface, surface defects, such as pin holes, other voids and sharp defects, become filled and covered, and the risk of high field strengths to occur at such defects is reduced. This reduces the risk of conditions that may lead to a short. In case there is still a situation of an imminent short, the short protection layer reduces the risk of detrimental impact on the organic layer and the risk of a short to occur between the cathode and the anode.

The stacked electro-optically active organic diode may be used in a lightning device, such as a lamp, a display device and in an organic solar cell device.

BRIEF DESCRIPTION OF THE DRAWINGS

This and other aspects of the present invention will now be described in more detail, with reference to the appended drawings showing currently preferred embodiments of the invention.

FIG. 2b schematically shows a cross-sectional view of a bilayer that is an alternative to the organic layer showed in FIG. 2a.

DESCRIPTION OF PREFERRED EMBODIMENTS

Figure 1:
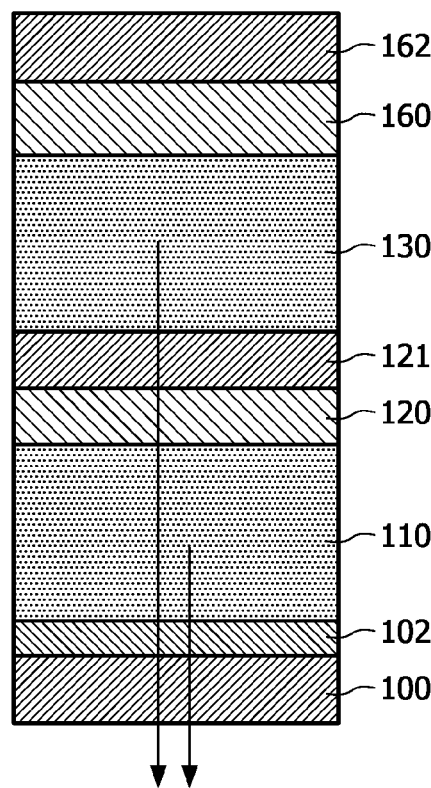
FIG. 1 schematically shows a cross-sectional view of layers in a stacked electro-optically active organic diode according to an embodiment.

FIG. 1 schematically shows a cross-sectional view of layers in a stacked electro-optically active organic diode according to an embodiment. The stacked organic diode comprises a substrate 100, an anode layer 102, a first electro-optically active organic layer 110, a connection layer 120, 121, a second electro-optically active organic layer 130, an inorganic short protection layer 160 and a cathode layer 162.

The substrate 100 is typically transparent and may for example be made of a ceramic, e.g. glass or silicon, a plastic or a metal. The substrate may be rigid or flexible.

The anode layer 102 is a hole-injecting layer, typically of a relatively high work function and electrically conducting material, and is typically transparent in order to let light through, which is indicated by an arrow in FIG. 1. One currently predominant example of a transparent material suitable for the anode layer is indium tin oxide (ITO). Other examples include metals, metal oxides, doped inorganic semiconductors, doped conducting polymers or small molecules etc. The thickness of the anode layer is typically in the range of about 100 Å to 3000 Å. The anode layer 102 may be deposited on the substrate by any of a variety of depositing techniques for thin films known in the art, for example, vacuum evaporation, sputtering, electron beam deposition or chemical vapor deposition.

The active organic layers 110, 130 each may comprise sub layers, but at least one active, emissive/absorbing layer for transformation of electricity to/from light. The total thickness any one of the organic layers 110, 130 may be above about 500 Å, but preferably above about 1000 Å. It may be noted that a smoother underlying surface, for example the anode layer or the substrate, in general allows for a thinner organic layer.

The first electro-optically active organic layer 110 and the second electro-optically active organic layer 130 can have the same structure and be of same materials and composition, however, in alternative embodiments the organic layers 110, 130 may differ in structure and/or materials and/or composition. The organic layers 110, 130 will be further discussed in connection with FIGS. 2a and 2b.

In FIG. 1, arrows indicate that light emitted from the organic layers 110, 130 typically passes out through the anode 102 and substrate 100, and that light can pass through the connection layer 120, 121. It may be noted that in alternative embodiments, the emitted light instead may be let out through a transparent cathode or through both the cathode and the anode, and in other alternative embodiments there may instead be absorption of light.

Still referring to FIG. 1, the connection layer 120, 121 is arranged between the organic layers 110, 130 and is a bilayer structure constituted of a low electron affinity layer 120 towards the first electro-optically active organic layer 110 and the anode 102, and a high electron affinity layer 121 towards the second electro-optically active organic layer 130 and the cathode 162. Both the high and the low electron affinity layer 121, 120 are of transparent, inorganic semiconductor materials, which typically are undoped.

The inorganic semiconductor material of the low electron affinity layer 120 may have an electron affinity between about 1 eV and about 3.5 eV and the inorganic semiconductor material of the high electron affinity layer 121 may have an electron affinity between about 4 eV and about 8 eV.

Materials that have been found to be suitable for the low electron affinity layer 120 are, for example, included in the chalcogenides or binary oxides of alkali earth metals or lanthanides, for example barium oxide (BaO), barium selenide (BaSe), lanthanum oxide ($La_2O_3$) and cerium oxide ($Ce_2O_3$). When the exemplified materials are forming the low electron affinity layer 120, e.g. after being deposited by thermal evaporation, there are typically vacancies of O or Se, and thus oxygen deficiency or selenium deficiency, which may be one reason behind that the short protection layer, although formed of per se undoped semiconductor materials, exhibit a conductivity that allow for comparatively thick layers.

Other examples may include mixtures involving chalcogenides and/or binary oxides of alkali earth metals, or lanthanides, or mixtures of chalcogenides and/or binary oxides of alkali earth metals with low electron affinity metals, such as alkali metals, alkali earth metals and/or lanthanides.

The dielectric constant of the inorganic semiconductor material may be greater than 1, for example greater than 10 or even 30. BaO, for example, has a dielectric constant of about 34.

The low electron affinity layer 120 should be deposited on the organic layer 110 in a way that is non-detrimental for the organic material. This include for example thermal evaporation. In case of a binary oxide of an alkali earth metal or lanthanide, such as BaO, $La_2O_3$ and $Ce_2O_3$, the low electron affinity layer 120 may be created by first depositing the alkali earth metal or lanthanide, for example by thermal evaporation, and then perform an in situ oxidation, for example by dosing oxygen into a vessel that has been used for the evaporation, to transform the alkali earth metal or lanthanide into a corresponding binary oxide. This may be particularly useful when the temperature needed for direct thermal evaporation of the binary oxide are very high.

Materials that have been found to be suitable for the high electron affinity layer 130 are for example included in binary oxides of transition metals, such as tungsten oxide ($WO_3$), molybdenum oxide ($MoO_3$) and vanadium oxide ($V_2O_5$).

Other examples may include mixtures involving binary oxides of transition metals, or mixtures of binary oxides of transition metals with high electron affinity metals and/or mixtures with organic materials. For example, inorganic materials suitable for the of high electron affinity layer may be co-evaporated with organic materials (e.g. aNPD) in order to improve charge transport of holes to/from the organics.

The high electron affinity layer 121 is typically deposited on the low electron affinity layer 120 by any one of a number of deposition techniques. Generally, high electron affinity materials are typically less reactive and in general easier to deposit than a low electron affinity materials. Also, the low affinity layer 120, which is of an inorganic material, is not typically not very sensitive to the depositing technique employed for the high electron affinity layer, and when low electron affinity layer 120 is comparatively thick, it may be even less sensitive. However, since thermal evaporation typically already has been involved when the low electron affinity layer was deposited, the high electron affinity material preferably is deposited by thermal evaporation also.

The low electron affinity layer 120 and high electron affinity layer may each have a thickness in the range of about 10 Å to 50 000 Å, preferably in the range of about 50 Å to 1000 Å. Thicker layers, such as above 200 Å, can be accomplished due to high transparency of transparent inorganic semiconductors.

Still referring to FIG. 1, the cathode layer 162 is typically a metallic material or a metal and may be a material having a comparatively low work function. However, in order to be environmentally stable and less reactive, typically a material is selected that has higher work function and is more stable, or a low work function material may be alloyed or combined with a more stable material. Examples of materials of a low work function are calcium (Ca), Magnesium (Mg) and Barium (Ba). Examples of materials of higher work function, but that are more stable, are aluminum (Al), copper (Cu) or silver (Ag). Typically, especially when light is to be emitted via the anode, the material of the cathode should be a good mirror, i.e. be reflective to the emitted light. For example, Al and Ag is considered as good mirror materials in this context. A not so low work function of the cathode may to some extent be compensated for by the short protection layer 160 which additionally may act as a electron injecting layer.

The thickness of the cathode layer 162 may be in the range of about 300 to 10000 Å. The cathode layer 162 may be deposited on the short protection layer 160 by any one of a number of conventional techniques including for example thermal evaporation.

The short protection layer 160 is of an inorganic semiconductor material that may have an electron affinity between about 0.5 eV and about 3.5 eV. This can adapt and minimize the injection barrier for electrons into the lowest unoccupied molecular orbital (LUMO) of the charge carrier organic layer, and the short protection layer may additionally act as an electron injection layer.

The inorganic semiconductor material of the short protection layer 160 may have a bandgap greater than about 2.6 eV, and preferably greater than about 3 eV. This means that blue electroluminescence may not be absorbed and that thus generation of photoelectrons is not possible at an interface between the short protection layer and the organic layer. Further, the short protection layer will be stable against hot electrons that may be generated at the interface between the short protection layer 160 and the cathode layer 162. Photoelectrons are thermalised in the short protection layer 160 and thus may not damage the organic layer. An advantageous side effect with a band gap greater than about 2.7 eV is that the short protection layer also will serve as a exciton blocking layer.

Moreover, the inorganic semiconductor material of the short protection layer 160 may have a melting point that is higher than the melting point of the cathode layer 162 material. This allows the organic diode to better withstand a situation where heat is developed that risks to melt the electrode material. A short protection layer that remains intact and rigid in such a situation further protects the organic layers from getting in direct contact with the electrode material and distributes the force and pressure exerted on the organic layers over a large surface, which reduces the risk of compressed and damaged organic layers.

Materials that have been found to be suitable for the short protection layer 120 are, for example, included in the chalcogenides or binary oxides of alkali earth metals or lanthanides, for example barium oxide (BaO), barium selenide (BaSe), lanthanum oxide ($La_2O_3$) and cerium oxide ($Ce_2O_3$). When the exemplified materials are forming the short protection layer 160, e.g. after being deposited by thermal evaporation, there are typically vacancies of O or Se, and thus oxygen deficiency or selenium deficiency, which may be one reason behind that the short protection layer, although formed of per se undoped semiconductor materials, exhibits a conductivity that allow for comparatively thick layers.

Other examples may include mixtures involving chalcogenides and/or binary oxides of alkali earth metals, or lanthanides, or mixtures of chalcogenides and/or binary oxides of alkali earth metals with low electron affinity metals, such as alkali metals, alkali earth metals and/or lanthanides.

The dielectric constant of the inorganic semiconductor material may be greater than 1, for example greater than 10 or even 30. BaO, for example, has a dielectric constant of about 34. Materials of a high dielectric constant reduces the field strength at for example sharp edges of a defect and thus help to decrease the risk of high field strengths that ultimately may lead to a short.

The thickness of the short protection layer 120 may be in the range of about 10 Å to 50 000 Å, preferably in the range of about 50 Å to 10 000 Å, and typically in the range of about 100 Å to 1000 Å. Often a thickness of at least 200 Å is desired. When the inorganic semiconductor forms the short protection layer, i.e. typically after being deposited by thermal evaporation, the layer is typically conducting, although less conducting than the cathode, and in spite of that the material used per se is a semiconductor. Being conductive allows for thicker layers which is beneficial for protection purposes. Better conductivity typically means that thicker layers are possible and thus better short protection. Often a thickness of at least 200 Å is desired. The thickness can be used to achieve a conduction that is beneficial for reducing currents that tend to increase and be detrimental in a situation of an imminent short.

When the short protection layer 120 is deposited on the organic layer 130, this should be done in a way that is non-detrimental for the organic layer, for example as described above in connection with deposition of the low electron affinity layer 120. The short protection layer may be of the same material as the low electron affinity layer. This facilitate manufacturing and is typically of interest when it is desired to have a short protection layer that also has electron injecting properties.

In an alternative embodiment the short protection layer 160 can be omitted and for example be replaced by a conventional inorganic electron injecting layer, such as of LiF, or the cathode can be arranged directly in contact with the second electro-optically active organic layer 130

Figure 2A:
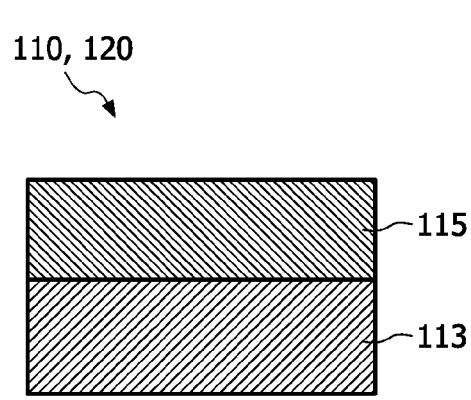
FIG. 2a schematically shows, by way of example, a cross-sectional view of a bilayer organic layer in an OLED as of FIG. 1.

FIG. 2a schematically shows, by way of example, a cross sectional view of the organic layers 110 and 130, i.e. this illustrates a situation where the two organic layers 110, 130 of FIG. 1 are substantially identical. The organic layer 110 here has a bilayer structure and comprises a hole-transporting layer 113 (HTL), for example of N,N'-diphenyl-N,N'-bis(1-naphthyl)-1,1'biphenyl-4,4"diamine (aNPD) and a combined electron-transporting and emissive layer 115 (ETL/EML), for example of $Alq_3$. The exemplified structure is per se known and is used in conventional OLEDs. It is an example of a so called small molecule structure. An OLED employing such a structure may be termed a small molecule light emitting diode (smoLED or SM-LED). The organic layers 111, 113, 115 are in a smoLED typically deposited by thermal evaporation or organic vapor phase deposition.

In addition to what has been presented here, it should be understood that a smoLED organic layer may comprise more or less layers, and layers of other organic materials, such as are used in conventional smoLEDs.

Figure 2B:
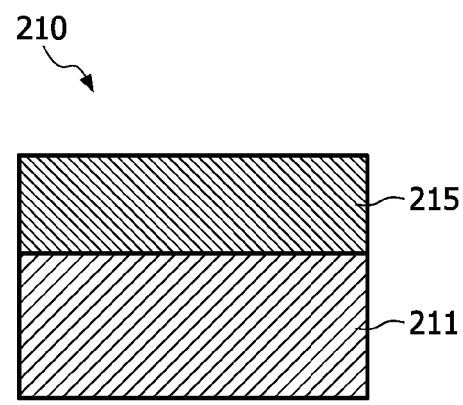

FIG. 2b schematically shows a cross sectional view of an alternative to the organic layer 110 and/or 130 of FIG. 2a, namely an organic layer 210 that has another bilayer composition than the organic layer 110 of FIG. 2a. The organic layer 210 here comprises an organic HIL 211, for example of poly(3,4-ethylenedioxythiophene) (PEDOT) and a combined ETL/EML 215, for example of polyfluorene (PF). The exemplified structure is per se known and is used in conventional OLEDs. It is an example of a so called large molecule, or polymer structure. An OLED employing such a structure may be termed a polymer light emitting diode (polyLED or PLED). The organic layers 211, 215 are in a polyLED are typically deposited by spin-coating or printing techniques.

In addition to what has been presented here, it should be understood that a polyLED organic layer may comprise more or less layers, and layers of other organic materials, such as are used in conventional polyLEDs.

Generally, the two organic layers 110, 130, or in other embodiments having, for example, more than two organic layers, each organic layer may have same or different layer structure, and be of same or different materials and/or compositions, as other organic layers in the stacked electro-optically active organic diode.

Hence, it should be understood that the present invention is not dependent on any particular electro-optically active organic layer, electro-optically active organic layer structure, composition or material of the electro-optically active organic layer, but that the principles of the invention are applicable and compatible to the vast majority of electro-optically active organic layers such as used in conventional OLEDs and other electro-optically active organic diodes.

Figure 3:
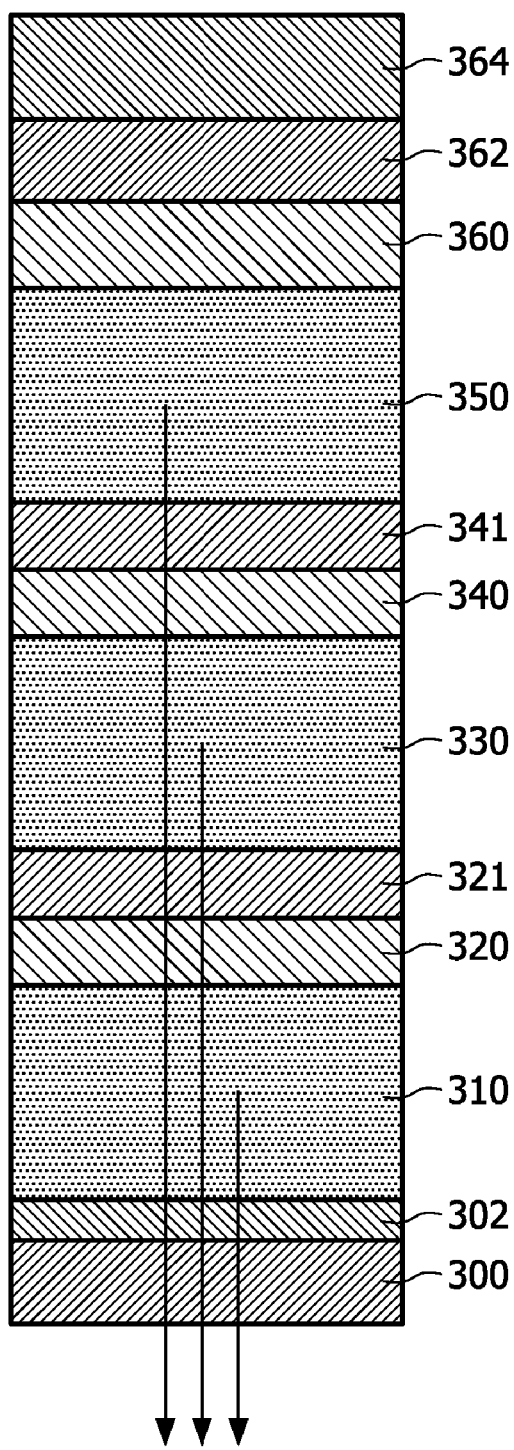
FIG. 3 schematically shows a cross-sectional view of layers in a stacked electro-optically active organic diode according to another embodiment.

FIG. 3 schematically shows a cross-sectional view of layers in a stacked electro-optically active organic diode according to another embodiment. Compared to FIG. 1, it is here yet another organic layer 350, i.e. totally three organic layers 310, 330, 350, and yet another connection layer 340, 341. Generally, there may be N organic layers and N−1 connection layers. When there are more than one connection layer, i.e. N>2, each connection layer may have same or different layer structure, and be of same or different materials and/or composition, as other connection layers in the stacked OLED. However, typically the connection layers are substantially identical.

In FIG. 3 there is also a cover layer 364 arranged on the cathode layer 362. The remaining layers 300, 302, 310, 320, 321, 330, 360 and 362, correspond to the respective layers 100, 102, 120, 100, 102, 110, 160 and 162 of the embodiment presented in connection with FIG. 1.

The cover layer 364 is preferably of a different but substantially chemically inert material with respect to the material of the cathode layer 362. The cover layer 364 is typically deposited on and completely covers one layer surface of the cathode layer 362. Sharp edge defects, such as pin holes, voids and other defects and damages in the cathode layer 362 surface can be covered and filled by the cover layer 364. One common cathode material that often is impaired by surface defects is Al. The material of the cover layer 364 may have a high dielectric constant that is greater than 1, for example greater than 10 or even 30. It may further be conductive.

In practice it has turned out that desired covering and filling properties of the cover layer 364, which eliminates surface defects and their detrimental impact, can be reached by one of many different materials, inorganic and organic, typically vapor phase deposited. Nevertheless, the materials are preferably thin film packaging materials or glues. Examples of thin film packaging materials are silicon nitride (SiN), silicon carbide (SiC), silicon dioxide ($SiO_2$) and aluminium oxide ($Al_2O_3$), typically deposited by plasma enhanced vapor deposition (PECVD), such as inductively coupled PECVD (IC-PECVD). Preferably glues are of epoxy-type, typically room temperature curable using two solutions, or UV-curable adhesives, typically using one solution of epoxy or acrylic type. When a glue is used, the filling and covering properties can be enhanced by reducing vicosity of the glue when it is applied, e.g. by heating to above room temperature, for example 70° C.

In addition to its filling and covering properties, the cover layer 364 may have environmental protection properties, for example by being inert to oxygen and humidity and thus protect the inner layers, e.g. the cathode layer 362 and the short protection layer 360, from these or other substances that can be detrimental but likewise hard to avoid in environments of manufacturing or use. However, environmental protection properties may instead, or also, be provided by a second cover layer (not shown) which may be deposited on the cover layer 364. When a glue is used for the cover layer, the glue may additionally be used for attaching the environmental protection layer, for example a glued glass cover lid as protection against, for example, in-diffusion of water.

Generally, the thickness of the cover layer 364 is not critical as long as there is enough material deposited to fill defects and cover the cathode layer 362 surface. However, the thickness may be about 1000 Å or more.

When the cover layer 364 is deposited and covers the cathode 362 surface, surface defects, such as pin holes, other voids and sharp defects, become filled and covered, and the risk of high field strengths to occur at such defects is reduced. This reduces the risk of conditions that may lead to a short. In case there is still a situation of an imminent short, the short protection layer 360 and/or the connection layers 320, 321, 340, 341 reduce the risk of detrimental impact on the organic layers 310, 330, 350 and the risk of a short to occur between the cathode and the anode.

An electro-optically active organic diode according to the present invention may be used in a lightning device, in an organic solar cell device, it can be an organic light emitting diode (OLED) and can be used in a lamp, in a display device, for example in a flat TV, a computer monitor, a digital camera, a mobile phone, and a vast number of other electronic gizmos.

A more specific embodiment will now be exemplified.

A stacked OLED comprises a 150 nm ITO layer deposited on a glass substrate, followed by a 100 nm aNPD layer and a 80 nm $Alq_3$ layer. A 20 nm BaO layer is deposited on the $Alq_3$ layer and is followed by a 20 nm $MoO_3$ layer. A second 100 nm aNPD layer is deposited on the $WO_3$ layer followed by a second 80 nm $Alq_3$ layer. A second 20 nm BaO layer is deposited on the second $Alq_3$ layer and is followed by a 100 nm Al layer.

The person skilled in the art realizes that the present invention by no means is limited to the embodiments and examples described above. On the contrary, many modifications and variations are possible within the scope of the appended claims.

The invention claimed is:

1. A stacked electro-optically active organic diode comprising:
   an anode electrode layer;
   a cathode electrode layer;
   a first electro-optically active organic layer arranged between said electrode layers;
   a second electro-optically active organic layer arranged between said first electro-optically active organic layer and said cathode electrode layer;
   a low electron affinity layer arranged between the first electro-optically active organic layer and the second electro-optically active organic layer, said low electron affinity layer having a thickness of at least 50 Å and being formed of a first transparent inorganic semiconductor material; and
   a high electron affinity layer arranged between said second electro-optically active organic layer and the low electron affinity layer, said high electron affinity layer being formed of a second transparent inorganic semiconductor material, wherein said second transparent inorganic semiconductor material has a higher electron affinity than said first inorganic semiconductor material.

2. The stacked organic diode stack as claimed in claim 1, wherein the first inorganic semiconductor material has an electron affinity between 0.5 eV and 3.5 eV.

3. The stacked organic diode stack as claimed in claim 1, wherein the second inorganic semiconductor material has an electron affinity between 4 eV and 8 eV.

4. The stacked organic diode as claimed in claim 1, wherein the low electron affinity layer has a thickness above 200 Å.

5. The stacked organic diode as claimed in claim 1, wherein the high electron affinity layer has a thickness of at least 20 Å.

6. The stacked organic diode as claimed in claim 1, wherein the first inorganic semiconductor material and/or second inorganic semiconductor material has higher melting temperature than the material of the cathode layer.

7. The stacked organic diode as claimed in claim 1, wherein the first inorganic semiconductor material has a band gap greater than 2.7 eV.

8. The stacked organic diode as claimed in claim 1, wherein the first inorganic semiconductor material comprises a chalcogenide or binary oxide of an alkali earth metal or lanthanide.

9. The stacked organic diode as claimed in claim 1, wherein the second inorganic semiconductor material comprises a binary oxide of a transition metal.

10. The stacked organic diode as claimed in claim 1, further comprising:
    a protection layer formed of an inorganic semiconductor material and arranged between the cathode electrode layer and the second electro-optically active organic layer, and adjacent to said cathode electrode layer.

11. The stacked organic diode as claimed in claim 1, further comprising: a cover layer arranged in contact with a surface of the cathode layer so that the cathode layer is positioned between the second electro-optically active organic layer and said cover layer, wherein said cover layer is formed of a substantially inert material with respect to a cathode layer material in contact with said cover layer, and wherein said inert material is deposited on said surface of said cathode layer.

12. The stacked organic diode as claimed in claim 1, wherein the high electron affinity layer has a thickness above 200 Å.

13. The stacked organic diode as claimed in claim 1, wherein the first inorganic semiconductor material comprises $BaO$, $BaSe$, $La_2O_3$, or $Ce_2O_3$.

14. The stacked organic diode as claimed in claim 1, wherein the second inorganic semiconductor material comprises $WO_3$, $MoO_3$ or $V_2O_5$.

* * * * *